United States Patent [19]

Strauss

[11] Patent Number: 4,821,089
[45] Date of Patent: Apr. 11, 1989

[54] PROTECTION OF IGFET INTEGRATED CIRCUITS FROM ELECTROSTATIC DISCHARGE

[75] Inventor: Mark S. Strauss, Allentown, Pa.

[73] Assignee: American Telephone and Telegraph Company, AT&T Laboratories, Murray Hill, N.J.

[21] Appl. No.: 59,194

[22] Filed: Jun. 4, 1987

Related U.S. Application Data

[63] Continuation of Ser. No. 787,764, Oct. 15, 1985, abandoned.

[51] Int. Cl.$^4$ ............................................. H01L 23/48
[52] U.S. Cl. ...................................... 357/68; 357/65; 357/51; 357/41; 357/52; 357/23.13; 357/23.6
[58] Field of Search ...................... 357/23.13, 51, 23.6, 357/40, 41, 52, 52 D, 68, 65

[56] References Cited

U.S. PATENT DOCUMENTS

| | | | |
|---|---|---|---|
| 3,555,374 | 1/1971 | Usuda | 317/235 |
| 3,590,340 | 6/1971 | Kokubunji-shi et al. | 317/235 R |
| 3,673,427 | 6/1972 | McCoy et al. | 357/23.13 |
| 3,676,742 | 7/1972 | Russell et al. | 317/33 R |
| 4,115,709 | 9/1978 | Inoue et al. | 357/23.13 X |
| 4,139,935 | 2/1979 | Bertin et al. | 357/23.13 |
| 4,295,176 | 10/1981 | Wittwer | 361/91 |

FOREIGN PATENT DOCUMENTS

| | | |
|---|---|---|
| 0143259 | 6/1985 | European Pat. Off. . |
| 52-63075 | 5/1977 | Japan . |
| 57-164571 | 9/1982 | Japan . |
| 202573 | 11/1983 | Japan . |

OTHER PUBLICATIONS

Phillips Electronic Components and Materials Division, Philips Application Book, MOS Integrated Circuits and their Applications, 1970, (Eindhoven, NL), pp. 107-110, see FIG. 101; p. 107, chapter: "Avalanche Bulk Breakdown Device".
Patent Abstracts of Japan, vol. 8, No. 49, (E-230), (1486), 6 Mar. 1984 & JP, A, 58202573, (Fujitsu), 25 Nov. 1983, see abstract; FIG. 3.
M. S. Sze: "Physics of Semiconductor Devices", Second Edition, 1981, John Wiley and Sons, (New York, U.S.A.), pp. 193-195, see egun. 1,2.
IBM Technical Disclosure Bulletin, vol. 24, No. 7A, Dec. 1981, (New York, U.S.A.), F. H. DeLaMoneda et al.: "Layout for Lateral NPN Protective Device Enhancing Chip Wireability", pp. 3427-3430, see entire document.
The Effects of Electrostatic Discharge on Microelectronic Devices—A Review, William D. Greason, G. S. Peter Castle.
Electrical Overstress/Electronstatic Discharge Symposium Sponsored by the EOS/ESD Association and ITT Research Institute.
Commerically Available Integrated Circuit, See FIG. 1 and FIG. 2 attached.
Application Mark. S. Strauss, Case #1, Filed Sep. 30, 1985, Ser. No. 782,014.

*Primary Examiner*—Andrew J. James
*Assistant Examiner*—William A. Mintel
*Attorney, Agent, or Firm*—James H. Fox

[57] ABSTRACT

Integrated circuits implemented in insulated gate (e.g., CMOS) technology have been protected from electrostatic discharge (ESD) by a metal gate field effect transistor. It has been recognized that a "parasitic" bipolar transistor exists in parallel with the metal gate device. Surprisingly, superior protection is obtained by omitting the metal gate, thereby relying only on the avalanche breakdown of the bipolar device for the opposite-polarity protection. It is postulated that the field effect of the metal gate device undesirably restricted the current flow in the prior art technique. The inventive technique may be advantageously implemented using a diode rather than a transistor as the protective element.

14 Claims, 3 Drawing Sheets

PROTECTION OF IGFET INTEGRATED CIRCUITS FROM ELECTROSTATIC DISCHARGE

This application is a continuation of application Ser. No. 787,764 filed Oct. 15, 1985 now abandoned.

BACKGROUND OF THE INVENTION

1. Field of the Invention

The present invention relates to protecting insulated gate field effect transistor (IGFET) integrated circuits from electrostatic discharge (ESD).

2. Description of the Prior Art

The protection of integrated circuits from electrostatic discharge has become a significant aspect of integrated circuit (IC) design. ESD protection is sometimes provided for bipolar IC's, typically with diodes or protective bipolar transistors. However, ESD protection is especially significant for insulated gate ICs, which have a gate insulator, typically an oxide, that is susceptible to breakdown when excessive voltages are present at an input terminal of the IC. The gate insulator breakdown voltage is typically less than 100 volts, and about 20 volts in one recent design. As gate insulator thicknesses are reduced in future high-density IC designs, the breakdown voltage will be reduced even more. On the other hand, electrostatic voltages frequently range above 1000 volts during the production or subsequent handling of an integrated circuit. The very high input impedance of the insulated gate field effect transistors then makes their destructive breakdown a significant possibility unless input protection techniques are used.

One prior art protection technique makes use of two diodes connected to the input circuitry of the IC; see FIG. 1. The cathode (n type semiconductor) of one diode is connected to the positive power supply voltage (VCC), whereas the anode (p type semiconductor) of the other diode is connected to the negative power supply voltage (VSS). Also shown are conductors 15, 16 which contact underlying guardring regions via windows 17, 18 through the dielectric layers. Each guardring is a doped semiconductor region of the same conductivity type as the top doped region of the corresponding diode. Guardrings are frequently included in CMOS designs to prevent latchup in operation, but may be omitted in some cases, such as NMOS designs. The diodes conduct when the input voltage at bondpad 10 exceeds one diode voltage drop, about 0.7 volts with silicon diodes, more negative or more positive than the power supply voltages when the IC is in operation. However, some types of ICs are specified to operate with input signals that exceed these limits. For example, a complementary metal oxide semiconductor (CMOS) IC may be designed to operate at a 5 volt nominal power supply voltage, but be required to accept an input signal voltage as high as 7 volts. The protection scheme of FIG. 1 would then result in conduction through diode 12 during operation, which is undesirable in many cases.

Referring to FIG. 2, an alternate protection scheme utilizes a field effect transistor as the protection element. Bondpad 20 connects to metal gate 22 of the protective element, and they are connected to the drain 21 by means of contact window 24. The source region 23 connects to a power supply potential ($V_{SS}$). For an n-channel device, the transistor conducts when the input voltage becomes more positive than the transistor threshold, which is typically about 20 to 80 volts. This allows high positive input voltages to be accepted while still providing protection. Negative input voltages are limited by the diode formed by the drain region (21) and the underlying substrate. A p-channel device protects in an analogous manner. In both the schemes of FIGS. 1 and 2, resistors may be provided between the input and the protective device.

The relatively high threshold voltage of the protective transistor of FIG. 2 is achieved by placing its gate over a relatively thick dielectric layer, which may include glass and/or field oxide. Referring to FIG. 3, the gate 30 is typically formed from a portion of a metal conductor level. The gate overlies the portion of the glass layer (37) that overlies the field oxide region 32. This field oxide region overlies the region 35 between drain 33 and source 34, whereby the channel is formed by application of a positive voltage to the gate. As shown, the gate conductor 30 also contacts the drain 33 through a window through the glass layer 31. It is also known to offset the contact window from the drain, with a conductive polysilicone link connecting the gate to the drain. This latter technique reduces the possibility that the gate conductor, typically aluminum, will "spike" through the drain region to the substrate 36 during the high current surge of an ESD event. The metal conductor 39 connects the source of the protection transistor to a power supply voltage terminal, typically VSS.

In addition to the protection afforded by the "metal gate" transistor of FIGS. 2 and 3, it is also recognized that a parasitic bipolar transistor exists in parallel with the metal gate device. That is, regions 33, 35, and 34 form the collector, base, and emitter, respectively, of a lateral npn bipolar transistor. Conduction occurs from collector to emitter at high positive voltages in the case illustrated. It is apparently believed to be desirable to obtain this parasitic bipolar transistor effect along with the metal gate field effect device, for purposes of providing additional ESD protection.

Although the protection of input devices is a well recognized need, it is also known that output devices are also subject to ESD failure. It has been found that larger transistor sizes, and uniformly spaced contacts windows to the source and drain regions, enhance the resistance of output transistors to ESD failure; see "Device ESD Susceptibility Testing and Design Hardening" L. F. DeChiaro, *Electrical Overstress/Electrostatic Discharge Symposium Proceedings*, p. 179 (1984). However, large device sizes are usually avoided in input protective devices, to minimize input capacitance.

SUMMARY OF THE INVENTION

I have invented an ESD protection technique for use with integrated circuits implemented in insulated gate field effect transistor technology. The technique relies on the reverse-bias avalanche breakdown of a diode junction for protection against excessive voltages of one polarity, and the forward bias conduction of the diode for protection against voltages of the opposite polarity. The diode may be included in a lateral bipolar transistor that does not have a conductive (e.g., metal) gate extending over the major portion of its base, thereby substantially avoiding the creation of a field effect channel due to the input voltage. Alternately, the diode may subsist as a two electrode device. The diode desirably has a long length compared to its width, to maximize the perimeter in relation to the total area of the diode. Contacting the diode along the major portion of its length enhances the protection by avoiding hotspots during ESD events.

DETAILED DESCRIPTION

The following detailed description relates to an improved technique for protecting the inputs of an IGFET integrated circuit from electrostatic discharge. The invention results from the discovery that improved protection is surprisingly obtained by omitting the metal gate of a metal gate field effect transistor used as a protection element. This results in the use of what was formerly considered a parasitic bipolar transistor as the protection element. The present technique may alternately be implemented using the avalanche breakdown of a diode that is formed in a manner that avoids excessive hotspots.

Figure 4:
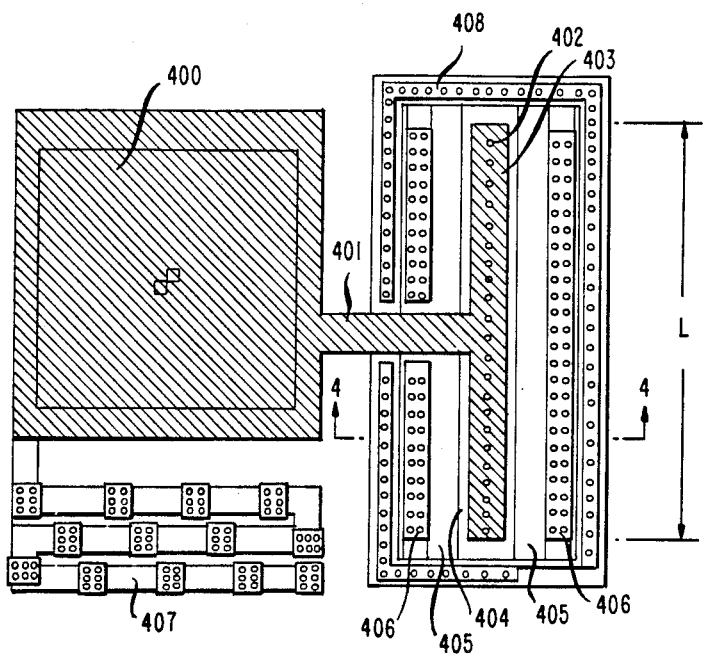
FIG. 4 illustrates a top view of one embodiment of the present technique.

Referring to FIG. 4, a top view of an integrated circuit portion using the present technique is shown. A metal bondpad 400 serves as a site for subsequent wirebonding of the IC to a package terminal. A metal conductor 401 connects the bondpad to the row of contact windows 402, which extend through a dielectric layer to an underlying doped semiconductor region, being the "collector" of the parasitic bipolar transistor. In the exemplary case, the collector is n-type semiconductor material. The metal conductor overlies a portion of the width of the collector in cross-hatched region 403. A region (404) of semiconductor material of the opposite doping type (e.g., p-type) that is adjacent to the collector forms the "base" of the parasitic bipolar transistor. Note that the metal conductor region 403 does not extend over the base region 404. Located adjacent the base is the "emitter" (n-type) semiconductor region 405. Note that the base and emitter are symmetric with respect to the collector as shown, which is desirable to utilize the maximum amount of collector perimeter area. However, an asymmetric structure is also possible. The emitter region 405 is connected to a power supply terminal via the contact windows 406. The power supply voltage applied to the terminal may be either positive (VCC) or negative (VSS). The IC input circuitry being protected is connected to the bondpad via link 407, which is typically a resistor having a resistance in the range of 100 to 10,000 ohms, and in the exemplary case 1400 ohms.

One significant aspect of the present invention is that the length (L) of the collector is significantly larger than the width (W) of the collector. I recommend a ratio of length to width (L/W) of at least 5, and preferably at least 10. Also of significance is that the collector is contacted by the input conductor along substantially the entire length (L) of the collector. This is conveniently accomplished using a multiplicity of contact window as shown, to aid in lithographic alignment. Alternately, one or a few long contact windows may be used.

The protective device optionally also includes a guardring region of doped (n-type) semiconductor material contacted through windows 408 that substantially surround the protective transistor. The windows connect the doped guardring region to a power supply terminal, being a positive (VCC) voltage terminal in the case of an n-type guardring.

Figure 1:
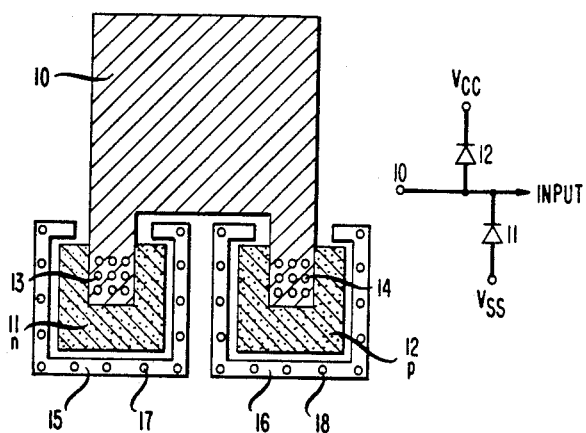
FIG. 1 illustrates a prior art two diode protection technique.
Figure 2:
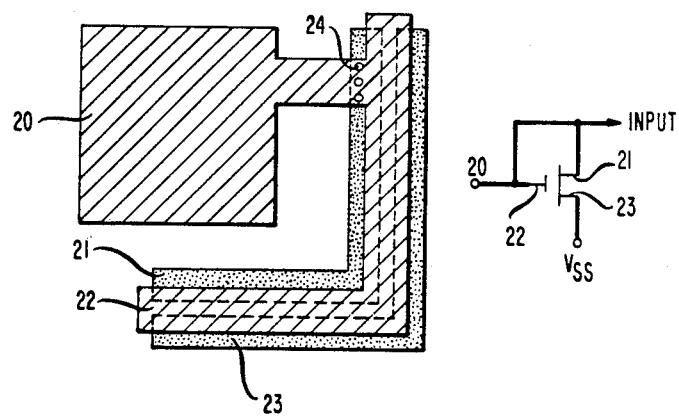
FIG. 2 illustrates a prior art metal gate field effect transistor protection technique.
Figure 3:
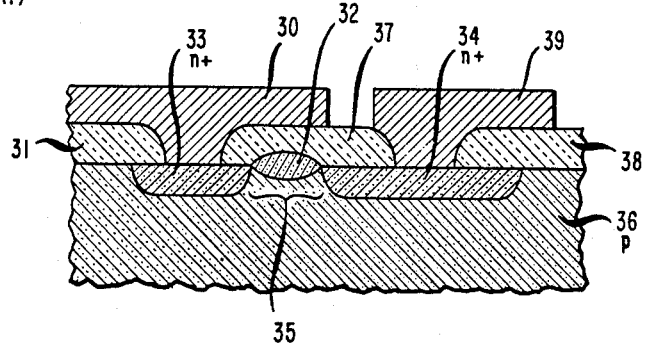
FIG. 3 illustrates in cross section the technique of FIG. 2.
Figure 5:
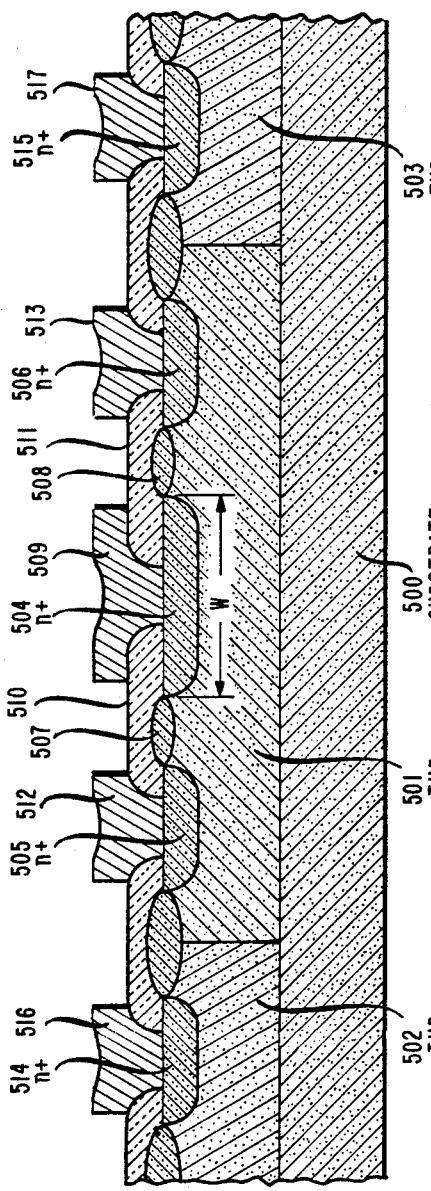
FIG. 5 illustrates a cross section of the lateral transistor embodiment of FIG. 4.

Referring to FIG. 5, a cross section taken along lines 4—4 of FIG. 4 is shown; for simplified illustration, only one row of contact windows to the "emitter" is shown. The semiconductor body 500 is typically a substrate or epitaxial layer grown thereon. A p-tub region 501 and n-tub regions 502, 503 are formed in the semiconductor body. One suitable technique for forming tube regions in a silicon semiconductor body is shown in U.S. Pat. No. 4,435,896 coassigned with the present invention. Formed in the p-tub region are collector region 504 (403 in FIG. 4) and emitter regions 505, 506, (405 in FIG. 4) being n+ type semiconductor regions in the exemplary case. Collector region 504 is separated from each emitter region by "base" regions (p-type) that are overlaid by field oxide regions 507, 508. In the prior art metal gate technique, the input conductor 509, typically aluminum, extended over field oxide regions 507, 508 and glass regions 510, 511 as shown in FIG. 3 above. However, in the present technique, the input conductor does not extend over the insulator overlying the base region separating the collector and emitter doped regions. The input conductor 509 desirably contacts collector 504 at a location laterally spaced from the edge of region 504, to reduce aluminum "spiking" through region 504. To minimize added capacitance, the top portion of input conductor 509 desirably does not extend laterally beyond the (n+) doped collector region 504. The emitters of the present technique are connected to a power supply, VCC or VSS, via conductors 512, 513. The guardring regions 502, 503 are contacted by doped (n+) regions 514, 515, and connected to the positive power supply (VCC) terminal by conductors 516, 517.

An exemplary embodiment illustrates the advantages of the present technique. A dynamic random access memory (DRAM) was constructed using the feature thickness shown in Table I, and having the doping levels shown in Table II. It is significant that these values are the same as for the (n-channel) input transistors being protected, and in fact were formed in the same operation.

TABLE I

| Feature | Thickness |
| --- | --- |
| Aluminum | 1.0 μm |
| N-Tub | 3.5 μm |
| P-Tub | 4.5 μm |
| Field Oxide Under Glass | 3,800 Angstroms |
| BPSG (Glass) | 7,000 Angstroms |

TABLE II

| Doping | Surface Conc. Ions/cm$^3$ | Sheet Resistance Ohms/Square |
| --- | --- | --- |
| N-Tub | $3.1 \times 10^{16}$ | 1,500 |
| P-Tub | $2.3 \times 10^{16}$ | 4,000 |
| N+ | $8.2 \times 10^{19}$ | 25 |
| P+ | $5.2 \times 10^{19}$ | 180 |

The memory cells utilized n-channel access transistors also formed in the same operation as the protective transistor. Hence, the access transistors had source/drain regions identical in doping level and depth as the collector/emitter regions of the protective device shown in FIG. 5. The gate oxide breakdown voltage of the access transistors was about 20 volts, and the avalanche breakdown of the protective diode occurred at about +14 volts, both with respect to the negative power supply voltage (VSS). Protection with respect to negative input voltages was obtained by the forward bias conduction through the p-n junction between regions 504, 501. The metal gate protective device of FIG. 3 was tested, wherein the channel width (dimension L in FIG. 4) was 154 micrometers, and the channel length (lateral distance between source/drain regions 33 and 34 of FIG. 3) was 4 micrometers. The width of the collector (dimension W in FIG. 5) was 10 micrometers. A bipolar protective device as in FIG. 5 was also tested, wherein the metal gate was omitted over the channel region. The foregoing dimensions otherwise remained the same, and doping of the metal gate device and the inventive bipolar device were identical. Surprisingly, it was found that the inventive bipolar device of FIG. 5 had a higher ESD failure threshold voltage than the metal gate device of FIG. 3. The present interpretation of these results is that the electric field produced in the channel of the metal gate device tended to restrict the ESD current flow to the surface region of the channel. This in turn created hotspots at the channel edge of drain region 33 of FIG. 3, resulting in failures. On the other hand, omitting the metal gate as in FIG. 5 allowed a larger portion of the peripheral area of the collector region 504 to conduct current.

The above findings suggest that the emitter region (505, 506) may also be omitted in some cases, since during an ESD event the chip is normally not connected to a power supply. Hence, while an emitter region may provide some additional collection of carriers, its inclusion is not necessary in all cases. This was confirmed by applying an ESD test voltage to a memory chip input protected by the inventive technique of FIG. 5, but with the VCC terminal disconnected; hence, emitter conductors 512, 513 were unconnected. Another protected input terminal was grounded. It was found that the ESD failure threshold voltage remained substantially the same from the case wherein the VCC terminal was grounded, which is the usual procedure for the "human body model" test.

These results also illustrate the importance of providing a large peripheral area of the collector region, to spread out the current and avoid hotspots. This is obtained in the present technique, while avoiding excess junction area that would produce undesirable excess input capacitance, by making the protective junction long and narrow; i.e., having a large L/W ratio, as noted above.

While the protective junction is shown as being straight in the top view of FIG. 4, other configurations are possible. For example, the junction may be bent or serpentine to save space or to conform to other circuit elements. The "length" of the junction then refers to the total path length along the junction, and the "width" is the width of a cross-section of the junction at a given point along the path.

Figure 6:
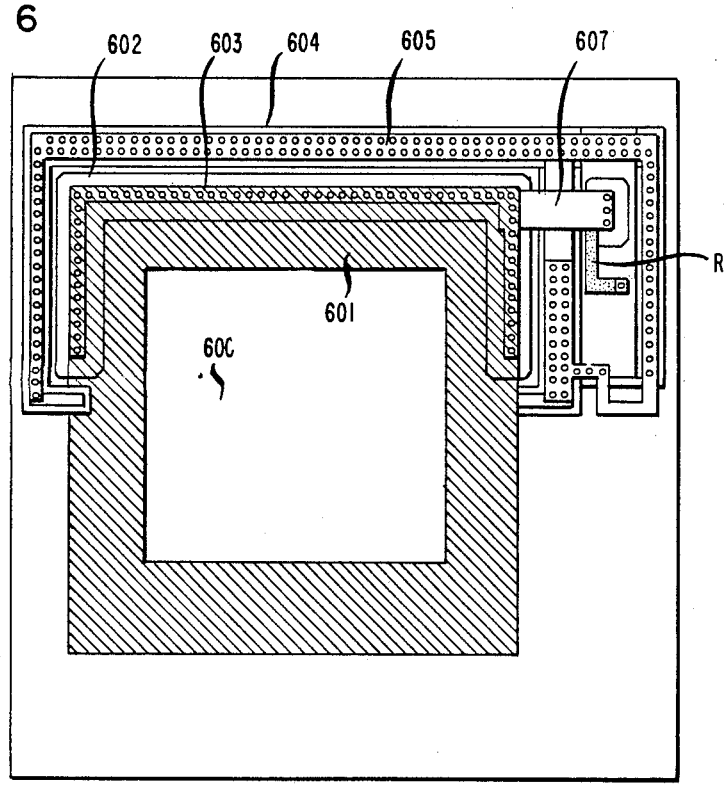
FIG. 6 illustrates a top view of a diode embodiment of the present technique.

One convenient location of the junction is under the periphery of the bondpad of the input being protected. Referring to FIG. 6, a top view shows a metal bondpad having a central portion 600 that is free of overlying dielectric material, and an outer portion 601 that is covered with a dielectric cap, usually $SiO_2$. The protective diode lies under the periphery of the bondpad at the top as viewed, and extending partially down the left and right sides as viewed. The total length of the diode may be chosen to obtain the desired protection while minimizing the added capacitance, and hence may extend a greater or lesser amount around the periphery than that shown. The diode is formed by an n+ implant in region 602, which is located in an underlying p-tub. Contact between the bondpad and the n+ diode region is obtained with windows 603 through intervening dielectric (deposited glass and grown silicon dioxide) layers. A n+ guardring may optionally be included, shown located in n-tub region 604 and connected to the positive power supply (VCC) via contact windows 605. The bondpad is coupled to the IC input circuitry via metal link 607 and resistor R.

Figure 7:
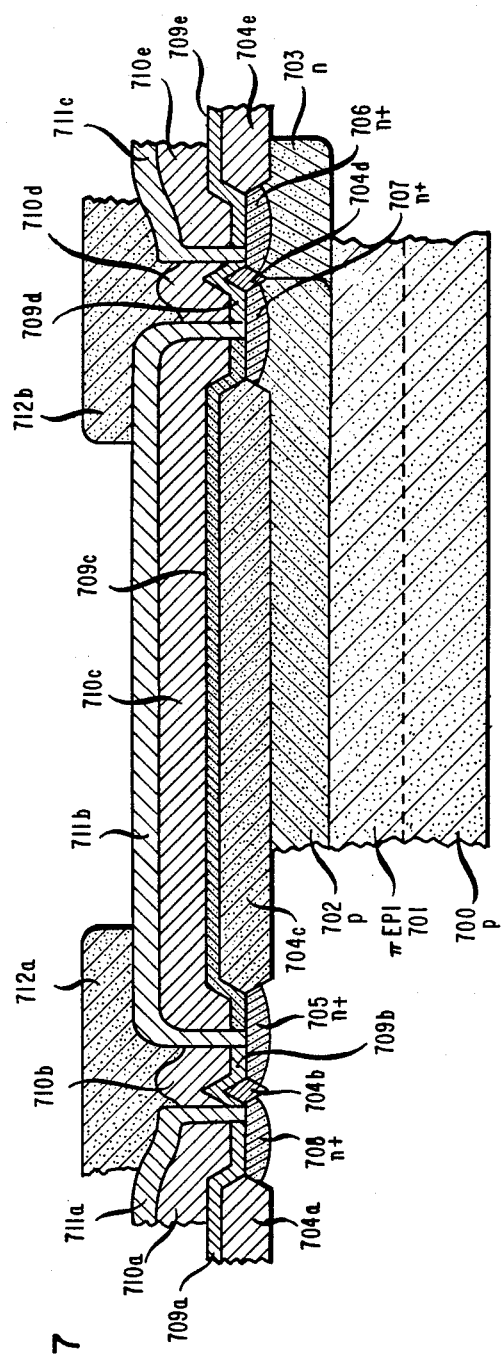
FIG. 7 illustrates a cross section of the diode embodiment of FIG. 6.

A cross section view of the structure of FIG. 6 is shown in FIG. 7. The metal bondpad layer 711b (600 in FIG. 6) connects to the n+ diode regions 705 and 707; these are sections of one long "U" shaped region 602 as indicated in FIG. 6, but may alternately be separate diode regions. Underlying the diode n+ regions is p-tub region 702. Also shown are n+ contact regions 708 and 706, which are formed in guardring region 703, being a n-tub region. Again, these regions are sections of "U" shaped regions extending around the bondpad as viewed in FIG. 6, but may alternately be separate regions. The guardring n+ contact regions are connected to a power supply voltage (VCC) by the metal layers 711a and 711c, extending through the dielectric layers 710 and 709 in FIG. 7.

One significant feature of the present invention that is illustrated in FIG. 7 is that a positive input voltage on the metal bondpad layer 711b will tend to form a channel in the p-tub region 702. However, this channel extends only between the diode top doped regions 705 and 707, which are both at the same potential, the input voltage. Hence, during an ESD event, no current will be conducted through this channel, and it thus will not produce deleterious hotspots. This illustrates one criterion placed on the input conductor; that it does not substantially extend over the doped semiconductor region (e.g., p-tub) in which the protective diode is formed to any other region of the opposite doping type (e.g., n-type) that is connected to an external terminal of the integrated circuit. Such other doped region is also referred to as a "connected" region herein. For example, the input conductor should not extend over the p-tub to an n+ contact region connected to a power supply terminal, or to an input terminal other than the one being protected. Otherwise, during an ESD event, the channel formed by the input conductor will tend to form a channel through which the ESD current will tend to be concentrated, leading to premature failure of the protective diode as noted above. The term "substantially" in this context does allow for the input conductor to overlie a portion of the p-tub, in order to contact the n+ "collector" region of the lateral transistor, as indicated by conductor 401 in FIG. 4. However, such an input conductor typically overlies the p-tub for less than 25 percent of the total length of the protective junction. Note also that the input conductor may be laterally offset from the protective junction, and connected thereto by a link of polysilicon or other conductive material, to prevent spiking through the junction.

What is claimed is:

1. An integrated circuit including at least one conductive bondpad coupled to an input electrode of an insulated gate field effect transistor having source and drain regions of a given conductivity type, wherein the gate insulator of said transistor breaks down at a breakdown voltage level, and wherein said bondpad has a periphery covered by a dielectric cap, and a central portion free of said cap, CHARACTERIZED IN THAT
said integrated circuit comprises a first semiconductor region of a first conductivity type and a second semiconductor region having the opposite conductivity type, thereby forming a protective p-n junction that limits the voltage applied to said gate insulator to a value less than said breakdown voltage level for a voltage of a given polarity applied to said bondpad, wherein said first semiconductor region is located only under the insulator that covers said periphery, and is contacted by the periphery of said bondpad on a plurality of sides of said bondpad.

2. The integrated circuit of claim 1 wherein the ratio of the length of said junction to the width of said junction is at least 5.

3. The integrated circuit of claim 1 wherein the ratio of the length of said junction to the width of said junction is at least 10.

4. The integrated circuit of claim 1 wherein said junction has a reverse breakdown voltage of less than 20 volts.

5. The integrated circuit of claim 1 wherein said first conductivity type is said given conductivity type.

6. The integrated circuit of claim 5 wherein the reverse breakdown voltage of said junction is less than said breakdown voltage level of said gate insulator.

7. The integrated circuit of claim 1 wherein a voltage of said given polarity applied to said bondpad reverse biases said junction.

8. The integrated circuit of claim 1 wherein a voltage of said given polarity applied to said bondpad forward biases said junction.

9. The integrated circuit of claim 1 wherein said junction limits the voltage applied to said gate insulator to the reverse breakdown voltage of said junction for a voltage of a first polarity, and to the forward conduction voltage of said junction for a voltage of the opposite polarity.

10. The integrated circuit of claim 1 wherein said bondpad contacts said first semiconductor region by means of a multiplicity of contact windows through an insulator underlying said bondpad.

11. An integrated circuit including a terminal coupled to an input output electrode of a field effect transistor having source and drain regions of a given conductivity type formed in a semiconductor body of the opposite conductivity type, CHARACTERIZED in that said integrated circuit comprises a protective p-n junction having a length-to-width ratio of at least 5 formed in said body by a first semiconductor region of said given conductivity type that is connected to said input terminal by means of a conductor extending substantially the entire length of said first semiconductor region; and further comprises a second semiconductor region of said given conductivity type that is spaced from said first semiconductor region and extends approximately the length of said first region, wherein said conductor does not extend substantially over the space between said first region and said second region, and wherein said second semiconductor region is connected to a power supply terminal of said integrated circuit.

12. The integrated circuit of claim 11 wherein said length-to-width ratio is at least 10.

13. The integrated circuit of claim 11 further comprising a third semiconductor region of said given conductivity type that extends approximately the length of said first region and is located on the opposite side of said first region from said second region, and is connected to a power supply terminal of said integrated circuit, and wherein said third region and said second region are equally spaced from said first region.

14. The integrated circuit of claim 11 wherein said first semiconductor region is formed in the same operation as said source and drain regions of said transistor.

* * * * *

UNITED STATES PATENT AND TRADEMARK OFFICE
CERTIFICATE OF CORRECTION

PATENT NO. : 4,821,089

DATED : April 11, 1989

INVENTOR(S) : Mark S. Strauss

It is certified that error appears in the above-identified patent and that said Letters Patent is hereby corrected as shown below:

Column 7, line 3, "input" should read --input/output".
Column 8, line 10, "input output" should read --input/output--.

Signed and Sealed this

Twentieth Day of November, 1990

Attest:

HARRY F. MANBECK, JR.

*Attesting Officer*                *Commissioner of Patents and Trademarks*